United States Patent [19]

Fong et al.

[11] Patent Number: 5,334,948
[45] Date of Patent: Aug. 2, 1994

[54] CMOS OPERATIONAL AMPLIFIER WITH IMPROVED RAIL-TO-RAIL PERFORMANCE

[75] Inventors: Edison Fong, Sunnyvale; Nghiem Nguyen, Mountain View, both of Calif.

[73] Assignee: National Semiconductor Corporation, Santa Clara, Calif.

[21] Appl. No.: 18,093

[22] Filed: Feb. 17, 1993

[51] Int. Cl.$^5$ ................................................. H03F 3/18
[52] U.S. Cl. ................................... 330/253; 330/258; 330/261
[58] Field of Search ........................ 330/253, 258, 261

[56] References Cited

U.S. PATENT DOCUMENTS

| | | | |
|---|---|---|---|
| 4,458,212 | 7/1984 | Beehmer et al. | 330/261 |
| 5,059,921 | 10/1991 | Vyne et al. | 330/261 |
| 5,130,580 | 7/1992 | Min et al. | 330/253 |

OTHER PUBLICATIONS

"A Rail-To-Rail Input/Output CMOS Power Amplifier"; Matthijs D. Pardoen et al.; IEEE 1989 Custom Integrated Circuits Conference; pp. 25.5.1–25.5.4.
"CMOS Low-Voltage Operational Amplifiers With Constant-Gm Rail-to-Rail Input Stage"; R. Hogervorst et al.; Reprint from Proceedings of the 1992 IEEE International Symposium on Circuits and Systems; San Diego, Calif.; May 10–13, 1992; pp. 2876–2879.

Primary Examiner—William L. Sikes
Assistant Examiner—Fetsum Abraham
Attorney, Agent, or Firm—Flehr, Hohbach, Test, Albritton & Herbert

[57] ABSTRACT

A CMOS constant gain operational amplifier (20) has two differential input circuits (22, 24), each having a current source (40, 40A) and a compensation circuit (45, 45A). Each compensation circuit (45, 45A) dynamically tracks the common mode input voltage relative to a respective supply voltage and generates a respective tracking voltage that is used to modulate the current source of the respective differential input circuit. By modulating the current sources in accordance with the common mode input voltage, the input circuits are maintained in their saturation mode of operation over almost the entire rail-to-rail voltage range of the operational amplifier. The amplification stage circuit (27) also includes a dynamic bias adjustment circuit (95) that adjusts the bias of pull-down transistors (88, 90, 92, 94) in the presence of high speed input signal transients so as to keep the pull-down transistors in the amplification stage circuit in their normal, saturation mode of operation. As a result, the operational amplifier maintains virtually constant open loop gain throughout its entire operating range.

14 Claims, 5 Drawing Sheets

CMOS OPERATIONAL AMPLIFIER WITH IMPROVED RAIL-TO-RAIL PERFORMANCE

The present invention relates generally to operational amplifiers. More particularly, the present invention relates to a CMOS operational amplifier with improved rail-to-rail performance, virtual constant open loop gain independent of common-mode input voltage, and an enhanced slew rate.

BACKGROUND OF THE INVENTION

Operational amplifiers (op amps) are high-gain voltage amplifiers. Typically, the two inputs to an op amp receive ungrounded values and the op amp acts as a differential amplifier, amplifying the voltage difference between the two inputs. Op amps are typically used in a feedback circuit wherein the properties of the circuit are controlled by the parameters of the feedback circuit components, not by the internal characteristics of the op amp. Thus, op amps are versatile general-purpose building blocks widely used in integrated circuit design.

A number of parameters are used to describe op amp performance. For instance, the "common mode range" is the maximum or minimum range of common polarity input voltage that can be simultaneously applied to both inputs of an op amp without producing saturation within the amplifier gain stages. The "slew rate" is the maximum rate of change of output voltage for a step input voltage. Reference is commonly made to the "rail-to-rail" voltage range of an op amp. The rail-to-rail range of an op amp refers to the voltage range between the low and high power supply voltages of the amplifier.

Rail-to-rail op amps are very desirable because they can be used as embedded input signal buffers for many integrated circuits, eliminating the need for an input buffer external to such integrated circuits. However, op amps have generally not been embedded into MOS and CMOS integrated circuits because of several deficiencies associated with prior art op amps. First, true rail-to-rail operation is difficult to achieve with prior art devices because transistor threshold voltage drops and drain to source saturation (vsat) voltages in normal circuit configurations make it hard to keep the op amp in the high gain region of operation for input voltages near the upper and lower ends of the voltage range. Another problem with prior art op amps is that the gain is unreliable since it varies with the common mode input voltage. This results in poor gain linearity as the input common mode voltage changes.

Another shortcoming associated with prior art op amps is that they have a limited slew rate and go into "slew limiting" in response to very fast input signal transients. That is, large variations in the magnitude of the input signal saturate the internal stages of the op amp. When this phenomenon occurs, the gain of the op amp temporarily drops to "zero". The external feedback circuitry is thus temporarily out of the loop, which extends the recovery time to unacceptable delay times.

OBJECTS AND SUMMARY OF THE INVENTION

It is a general object of the present invention to provide an improved CMOS operational amplifier.

It is a more particular object of the present invention to provide an operational amplifier with improved rail-to-rail performance.

It is another object of the invention to provide an operational amplifier with virtual constant open loop gain independent of the input common mode voltage.

It is another object of the invention to provide an operational amplifier with an improved slew rate performance.

These and other objects are achieved by a constant gain operational amplifier in accordance with the invention. The input stage of the operational amplifier includes an N-channel differential input circuit and a P-channel differential input circuit, each having its own current source, as well as an N-channel compensation circuit and a P-channel compensation circuit. Each compensation circuit includes a common mode voltage tracking circuit that dynamically tracks the common mode input voltage. The current source in each differential input circuit is dynamically compensated in the presence of a high or low common mode voltage so that the transistors of the input stage differential circuit remain in their high gain saturation region of operation. The operational amplifier also includes a self-biasing summing network and amplification stage that adjusts the biasing of the summing network in the presence of input signal spikes that would otherwise exceed the operational amplifier's ability to track the input signal in such a way as to keep the summing network in its normal high-gain mode of operation.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENTS

Figure 1:
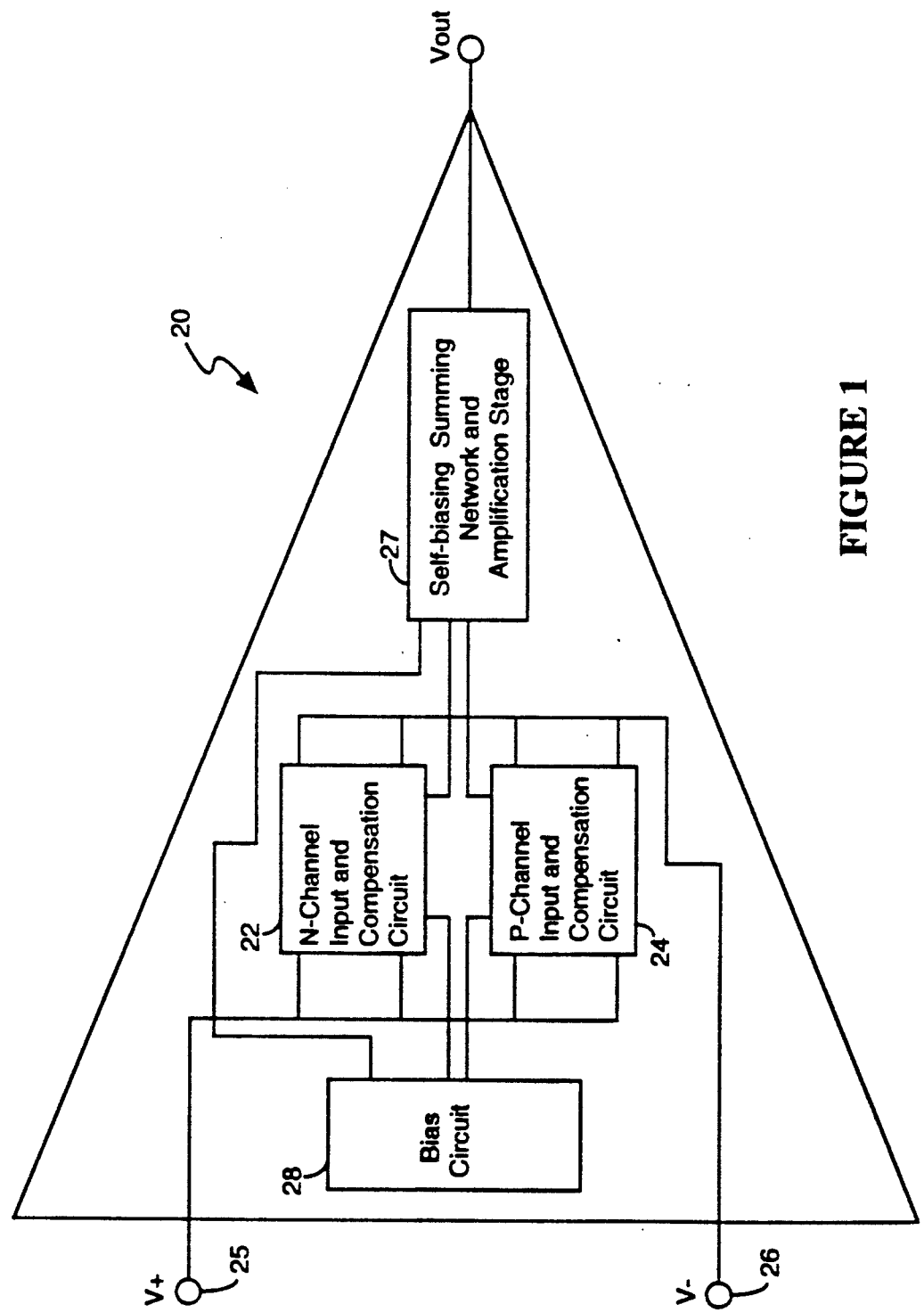
FIG. 1 is a simplified representation of the op amp of the present invention.

FIG. 1 depicts the major components of an op amp in accordance with the present invention. The op amp 20 includes an N-channel input circuit 22 and a P-channel input circuit 24. Each circuit 22, 24 has two connections to the V+input node 25 and two connections to the V−input node 26. The output from each circuit is conveyed to a self-biasing summing network and amplification stage 27. A bias circuit 28 provides a dc bias current for the N-channel input circuit 22, the P-channel input circuit 24, and the self-biasing summing network and amplification stage 27.

By way of overview, the op amp of the present invention executes the following unique functions. Virtual constant open loop gain with rail-to-rail inputs, and thus improved rail-to-rail performance, is obtained with the present invention by the use of a compensation circuit for each differential input circuit that modulates the current sources to its respective differential input circuit in accordance with the common mode input voltage. The compensation circuit for each input circuit generates a current source control voltage that tracks the common mode input voltage to the op amp. The common mode input voltage is the lower of the two input voltages for the N-channel input circuit and is the higher of the two input voltages for the P-channel input circuit. The magnitude of the current sourced to each differential input circuit is modulated in accordance with the tracked common mode voltage so that the gain of the differential input circuit remains virtually constant regardless of the common mode voltage. In addition, the source current is modulated so that as one of the differential pairs is turning off due to the common mode input voltage approaching one of the voltage supply rails, the other is being turned on more heavily to compensate for the transconductance lost from the other pair. Because the bias current changes according to the input common mode voltage, the differential pair transistors remain in their saturation region of operation for an extended period compared to conventional differential input circuits.

Also, notice that the sourced current for each differential pair varies as a square of the changing input common mode voltage. Thus the gain (i.e., transconductance) of the differential pair increases linearly with changes in input common mode voltage. Past circuits increased the gain as a square root of the input voltage.

A pair of cascoded transistors serve as the current source for each of the differential input circuits. In the case of the N-channel input circuit 22 of the preferred embodiment, the common mode voltage tracking circuit applies a first tracking voltage, substantially equal to the common mode voltage, to the gate of the N-channel cascode transistor closest to the circuit ground node. A compensation circuit generates a second, level shifted tracking voltage that is approximately 0.3 volts higher than the first tracking voltage, and that second tracking voltage is applied to the gate of the other N-channel cascode transistor of the current source.

Thus, the gate voltages applied to the current source transistors of the N-channel differential input circuit are reduced when a low common mode voltage is applied, thereby reducing the amount of current sourced to the differential input circuit. As a result, the differential input transistors remain in the saturation region of operation for lower applied common mode voltage compared to a differential input stage with a fixed bias current source.

In a similar manner, a compensation circuit for the P-channel differential input circuit 24 decreases the current supplied by its current source when a high common mode voltage is applied to the operational amplifier so as to maintain the P-channel differential input transistors in their saturation mode of operation for optimal gain.

Another feature associated with the op amp of the invention is the self-biasing amplification stage circuit 27 which improves slew rate performance. As will be explained in more detail below with reference to FIG. 4, the self-biasing amplification stage circuit 27 provides dynamic biasing of its folded cascode summing network in response to the output signals generated by the differential input circuits. In particular, the folded cascode summing network includes a bias compensation circuit that responds to fast, downward transitions of the output signals from either or both of the differential input circuits by quickly reducing the gain of the portion of the summing network formed by cascoded transistors coupled to the circuit ground. This bias compensation circuit prevents the voltages at the summing nodes from transitioning to such a low voltage that the cascoded transistors enter their linear region of operation, which would unbalance the summing network and prevent normal operation of the amplification circuit 27 until the summing nodes both return to their normal voltage ranges.

Figure 2:
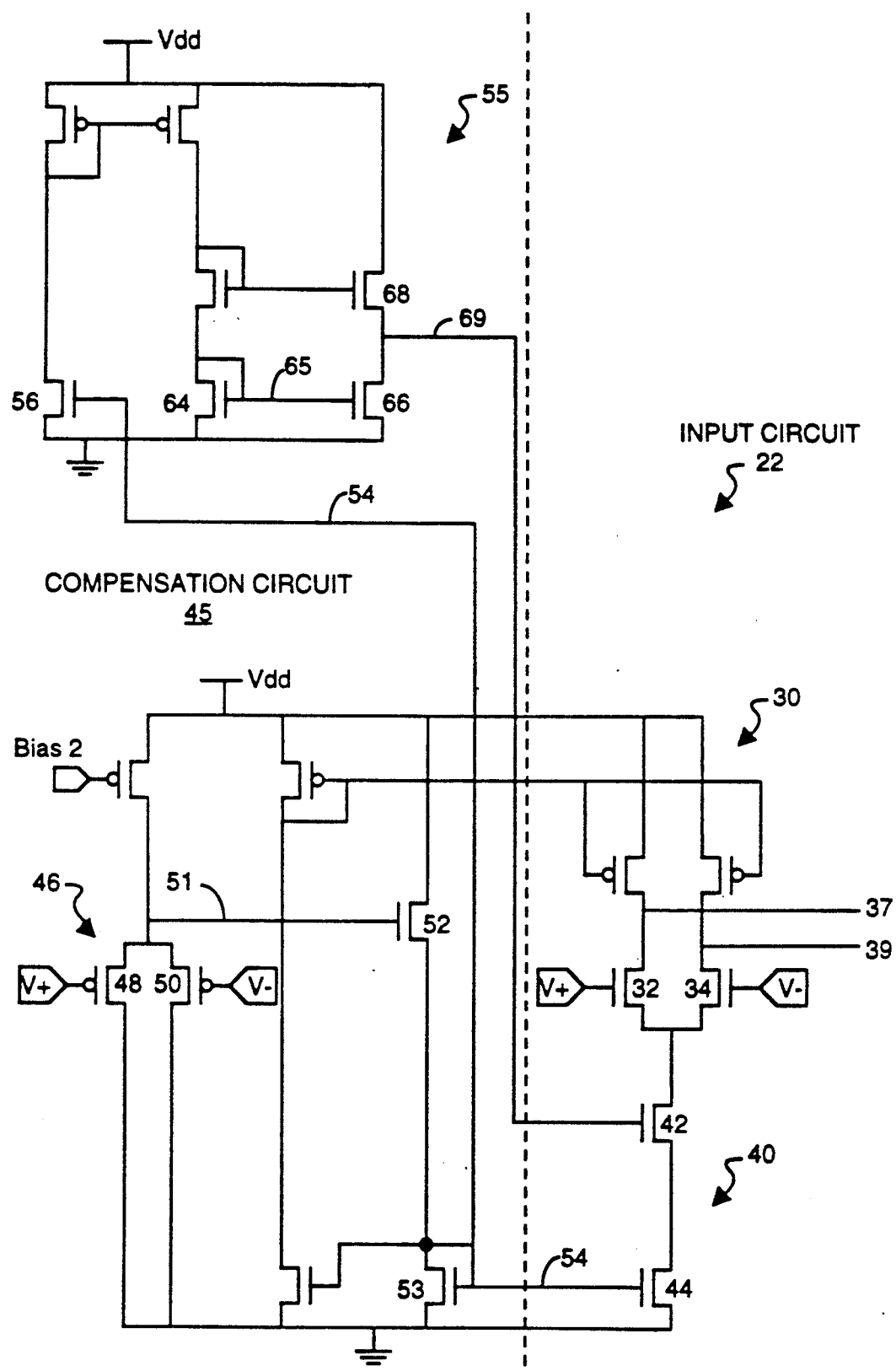
FIG. 2 is a schematic representation of the N-channel input circuit of the invention.

The described functional attributes of the circuit of the invention will now be more particularly described in relation to the figures. An N-channel input circuit 22 is depicted in FIG. 2. The N-channel circuit 22 includes a differential input circuit 30, including N-channel MOS transistors 32 and 34, which compare the voltages of the V− and V+ input signals. The current source 40 for the differential input circuit 30 is formed by two cascoded N-channel transistors 42 and 44. The gain of the N-channel input circuit 30 is governed by the operating points of the input transistors 32 and 34, which in turn is governed by the magnitude of the current supplied by the cascode current source 40.

As the common mode voltage gets very low, the transistors 32 and 34 in the N-channel differential input stage 30 begin to turn off. If the current source 40 were to continue to supply a large current to the differential input circuit, transistors 42 and 44 would fall into their linear range of operation, resulting in a loss of gain. In accordance with the invention, the current supplied by the cascode current source 40 is modulated by a compensation circuit 45 to maintain the input stage transistors 32 and 34 in their high gain saturation region of operation. In particular, a common mode tracking circuit 46, formed by a "differential" pair of P-channel transistors 48 and 50, is used to track the common mode input voltage. Note that the tracking circuit 46 generates a voltage on node 51 that is one threshold (e.g., 0.8 volts) above the common mode input voltage. In other words, the voltage on node 51 is about $V_T$ more than the lower of the V− and V+ input voltages, where $V_T$ is the threshold voltage of transistors 48 and 50.

Node 51 is coupled to N-channel transistor 52, and thus the voltage on node 51 controls the current through transistor 52. This current is passed through a diode connected N-channel transistor 53, which generates a control voltage on node 54 which is approximately one $V_T$ below the voltage on node 51. That is, the current source control voltage on node 54 is equal to the common mode voltage.

As the common mode voltage gets very low, the P-channel differential pair 46 will turn on, thereby pulling node 51 low. This, in turn, reduces the drive current for transistor 52 and the resultant current at its source. Therefore, the current at node 54 is reduced and the gate current for transistor 44 is reduced, thereby diminishing the pull-down effect of the current source 40.

The modulation of the current source 40 is further realized in the invention by the operation of the level shifting circuit 55. The gate of the input transistor 56 of the level shifting circuit 55 receives the voltage of node 54. The level shifting circuit 55 acts as a voltage mirror so that the voltage at the gate of transistor 56 is the same as that at the shared gate (node 65) of transistors 64 and 66. Appropriate sizing of transistors 66 and 68 will generate a desired voltage level for the gate of cascode transistor 42. Specifically, by making the channel width of transistor 68 approximately four times larger than that of transistor 66, node 69 receives a control voltage of approximately 0.3 volts above the voltage at node 54.

Thus, the P-channel differential pair 46 tracks the common mode input voltage. At high common mode input voltages the differential pair 46 is off, allowing a large gate current for current source transistors 42 and 44. The gate voltage at node 54 is about one $V_T$ below Vdd, and the voltage at node 69 is approximately 0.3 Volts above the voltage at node 54. At low common mode voltage, the differential pair 46 is turned on, thereby reducing the drive current to the current source 40. Specifically, node 54 is set to the common mode voltage, while node 69, through the level shifting circuit 55, is set to the common mode voltage plus a small boost voltage. At common mode input voltages less than one $V_T$, current source 40 is completely off.

Thus, the compensation circuit 45 of the invention reduces the draining of current by the current source 40 in the presence of a low common mode voltage. This allows the transistors 32 and 34 to remain in a saturated state so that high gain can be preserved. In the presence of high common mode voltage, the amount of current generated by current source 40 increases as a square of the input common mode voltage. Thus transconductance on input circuit 22 increases linearly with increases in the input common mode voltage.

The linear increase in the first input circuit's gain with increasing common mode voltage is matched by a symmetric linearly decreasing gain for the second input circuit 24 for common mode voltages between $Vdd-V_T$ and $Vss+V_T$. For common mode voltages above that range, the second input circuit 24 will turn off but the first input circuit's gain will continue to increase. This continued increase in gain of the first input circuit 22 helps to compensate for loss of gain in the output stage 27 (which losses gain as it approaches the voltage supply rails). Similarly, at common mode voltages below $Vdd-V_T$, the first input circuit 22 shuts off but the second input circuit 24 continues to linearly increase its gain, thereby compensating for loss of gain in the output stage 27 at the bottom voltage rail. Thus, the gain compensation circuitry in the input circuits 22 and 24 fosters constant open loop gain and improved rail-to-rail performance.

Figure 3:
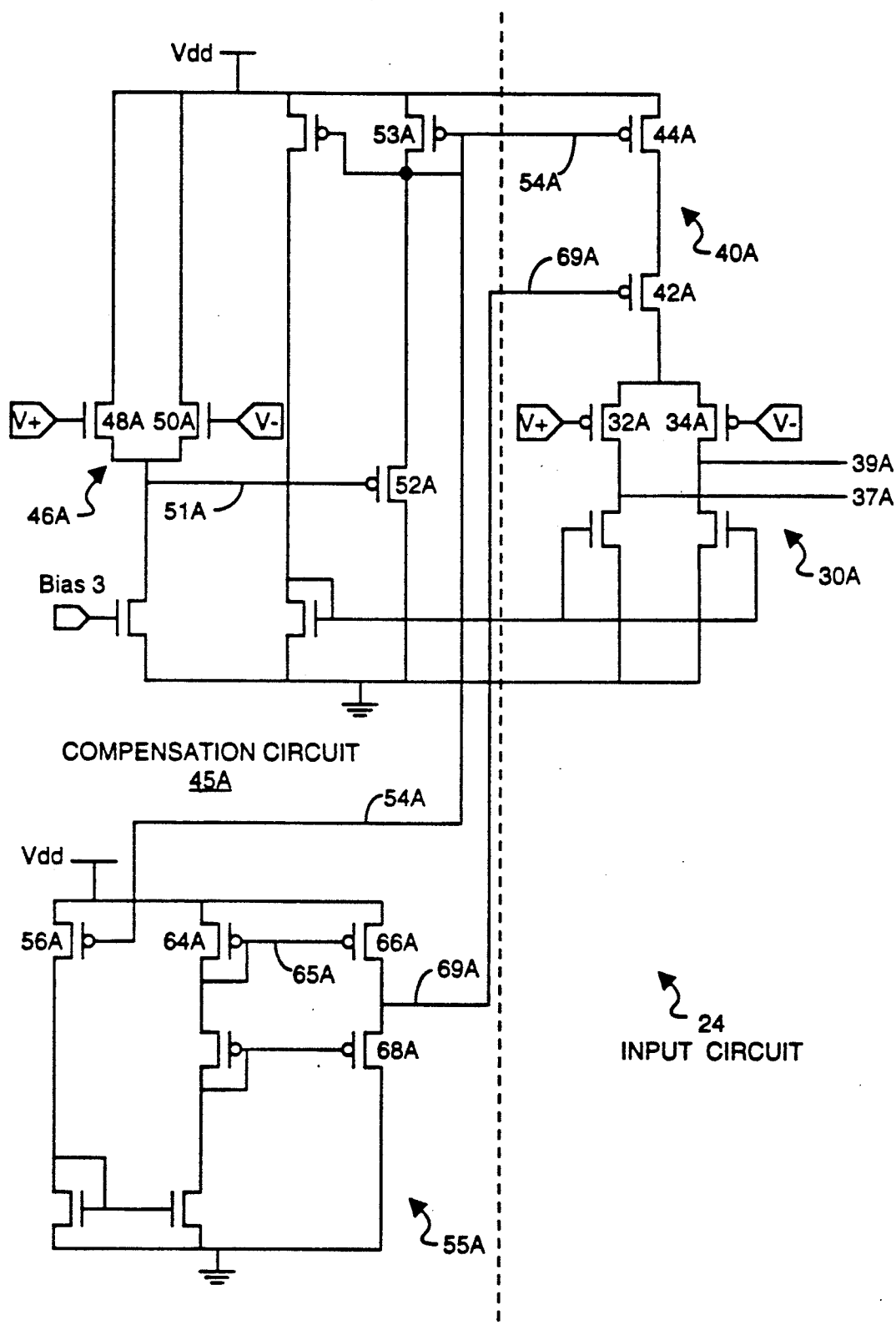
FIG. 3 is a schematic representation of the P-channel input circuit of the invention.

FIG. 3 shows the P-channel input circuit 24. The P-channel input circuit 24, including compensation circuit 45A, operates in the same manner as the N-channel input circuit 22 and compensation circuit 45, except that the polarities of the voltages and the transistor types used are reversed. In FIG. 3 the components of input circuit 24 corresponding to those in circuit 22 have been given the same reference numbers with the letter "A" appended to each such reference numner. Note that the "common mode input voltage" for the P-channel input circuit 24 is the higher of the two input voltages V+ and V− because the "common mode voltage" is measured with respect to Vdd, rather than with respect to the circuit ground voltage. By providing a P-channel input circuit 24, both "rails" of the input voltage extremes are processed by the op amp 20 of the invention.

Figure 4:
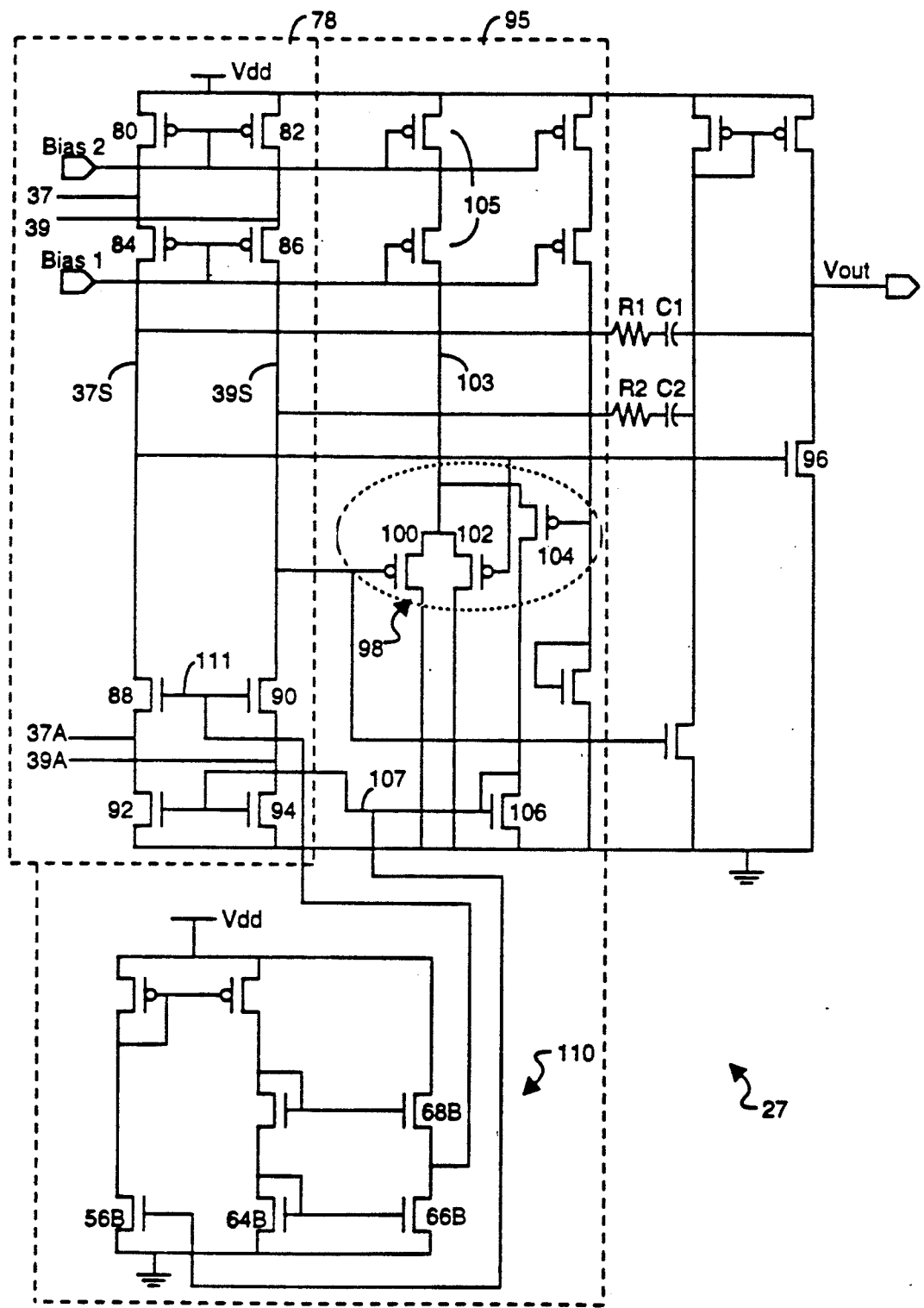
FIG. 4 is a schematic representation of the self-biasing amplification stage of the invention.

Turning now to FIG. 4, the amplifier circuit 27 has a folded cascode summing circuit 78 that includes transistors 80, 82, 84, 86, 88, 90, 92, and 94. The voltages produced by the two differential input circuits 22 and 24 on nodes 37, 39 and 37A, 39A are summed by the folded cascode 78 to produce summed signals on nodes 37S and 39S. The transistors of the folded cascode are biased so that nodes 37S and 39S, under normal operating conditions, are biased somewhere between 1.0 and 1.2 volts. The folded cascode circuit 78 provides most (perhaps seventy percent) of the signal amplification generated by the op amp. As discussed above, the gain of the output stage 27 is reduced when the common mode input voltage is near either of the voltage supply rails, and that loss of gain in the output stage 27 is compensated by increasing the gain of the input circuit 22 or 24 that remains on.

The biasing of pull-up transistors 80, 82, 84 and 86 is constant, while the biasing of pull-down transistors 88, 90, 92 and 94 is variable. More specifically, the biasing of the pull-down transistors 88, 90, 92 and 94 varies from its "normal" setting only when the operational amplifier receives a very fast input signal voltage transition, which causes a sudden drop in the voltage on one of lines 37S and 39S. The problem with a large voltage drop on either 37S or 39S is that this would cause two of the pull-down transistors 88 and 92, or 90 and 94, to enter their linear region of operation, which would prevent the operational amplifier from functioning.

A large-voltage swing, high speed input signal transient (also called a high slew rate condition) is detected by use of a differential comparator 98 that effectively monitors the average of the voltages on nodes 37S and 39S. Transistors 100 and 102 from one side of the differential comparator 98 with transistor 104 as the reference transistor. The comparator 98 has a standard current source 105, 105A that supplies a constant amount of current to the differential comparator. When the voltage on node 37S goes lower than its normal bias point, transistor 102 conducts more current that its normal bias level. Similarly, when the voltage on node 39S goes lower than its bias point, transistor 100 conducts more current than its normal bias level. Since the total amount of current conducted through transistors 100, 102 and 104 must remain constant, the current through transistor 104 is reduced whenever a sudden input signal transient causes the average of the voltage levels on nodes 37S and 39S to drop. Note that transistor 104 is biased in an ON state and conducts a maximum current when nodes 37S and 39S are both near their normal bias voltage levels. The source of transistor 104 is coupled to the drain of diode connected transistor 106.

When a sudden input signal transient produces, by way of the input circuits 22 and 24, a downward voltage spike on node 37S or 39S, the net amount of current conducted by transistors 100 and 102 will increase, thereby causing the current conducted by transistor 104 to decrease by a corresponding amount. The decreased current through transistor 104 is mirrored by transistor 106 and node 107 to the common gate of pull-down transistors 92 and 94. As a result, the gate voltage for transistors 92 and 94 drops, and these transistors conduct less current. This technique alone will not necessarily be sufficient to prevent slew limiting because transistors 88 and 90 can still drop into the linear region of operation for extremely fast transients. Level shifting circuit 110 remedies this by generating a voltage on node 111 that tracks the voltage on node 107.

Node 107 is coupled to the input of level shifting circuit 110, which is identical in configuration and function to the level shifting circuit 55 discussed in relation to FIG. 2. The output of level shifting circuit 110 on node 111 is approximately 0.3 V greater than the voltage on node 107. Thus, the common gate node 111 for transistors 88 and 90 tracks the bias voltage on node 107, keeping transistors 88 and 90 in their saturation region of operation even in the presence of a large downward spike on node 37S or 39S. The drop in voltage on node 111 thus prevents transistors 88 and 90 from falling into their linear region of operation, preventing the op amp from "slew limiting". Preferably, the gate node 107 for transistors 92 and 94 is biased between 1.0 and 1.25 V, and the gate node 111 for transistors 88 and 90 is biased between 1.25 V and 1.5 V.

In sum, the dynamic biasing circuit 95 of the amplifier circuit 27 prevents the pull-down transistors 88, 90, 92 and 94 of the summing network 78 from falling into the linear region of operation in the presence of a high speed input signal transient. This functionality is achieved through the use of a differential transistor pair 98 that monitors the voltages on nodes 37S and 39S and generates dynamic biasing as necessary.

Dynamic biasing is only required for the pull-down transistors of the summing network. This is because the quiescent voltage at the summing nodes 37S and 39S is kept low (e.g., less than 1.5 volts). Transistors 88 and 90 would therefore fall into the linear region of operation much faster than transistors 84 and 86, and thus transistors 88 and 90 become the limiting factor with respect to slew limiting. The pull-up devices 80, 82, 84, and 86 have fixed bias voltages.

Figure 5:
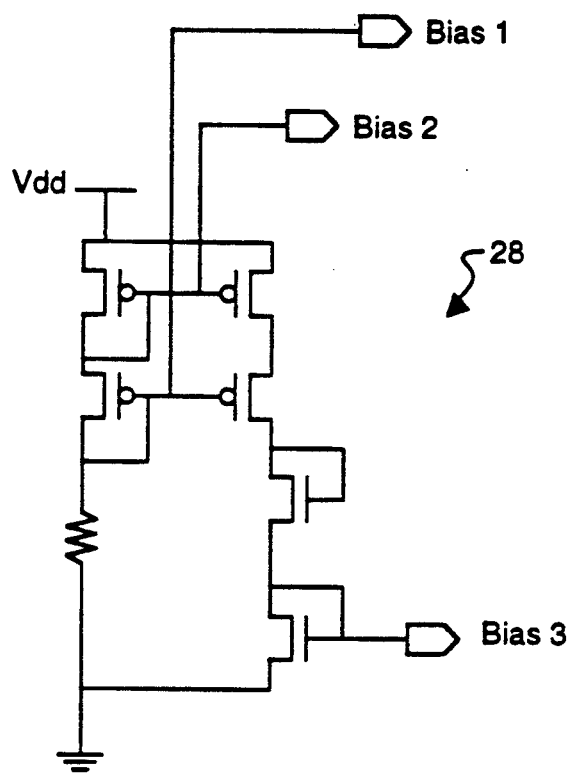
FIG. 5 is a bias circuit which may be used in accordance with the invention.

FIG. 5 depicts a bias generator circuit 28 that provides fixed bias voltages to the input circuits 22 and 24 and the amplifier circuit 27. In one embodiment of the invention, when the CMOS op amp is provided with a Vdd value of approximately 5.0 V and a Vss value of 0 V, circuit 28 generates a Bias 1 value of approximately 2.5 V, a Bias 2 value of approximately 3.75 V, and a Bias 3 value of approximately 1.3 V.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. An operational amplifier comprising:
   a V+ input node and a V− input node;
   a differential input circuit, coupled to said V+ and V− input nodes, said differential input circuit including a pair of transistors, each of said pair of transistors having a gate coupled to a different one of said V+ and V− input nodes, and a current source, coupled to said pair of transistors, said current source supplying a controllable current to said pair of transistors; and
   a voltage tracking circuit coupled to said current source and said V+ and V− input nodes, said voltage tracking circuit generating a tracking voltage that corresponds to the one of said V+ and V− signals having a lower voltage and modulating said controllable current supplied by said current source in accordance with said tracking voltage so as to maintain said pair of transistors in a saturated, high gain state.

2. The operational amplifier of claim 1 wherein said current source includes a cascoded transistor pair, said cascoded transistor pair including a first current source transistor coupled to a second current source transistor.

3. The operational amplifier of claim 2 wherein said voltage tracking circuit includes a second pair of transistors, each of said second pair of transistors having a gate coupled to a different one of said V+ and V− input nodes.

4. The operational amplifier of claim 3 wherein said voltage tracking circuit further includes a level shifting circuit that generates a second tracking voltage having a predefined voltage offset from said tracking voltage, wherein said tracking voltage is coupled to said first current source transistor and said second tracking voltage is coupled to said second current source transistor.

5. The operational amplifier of claim 1 further comprising
   a second input circuit a second differential input circuit, coupled to said V+ and V− input nodes, said first and second differential input circuits generating first and second intermediate output signals;
   an amplification stage circuit, including a summing network that combines said first and second intermediate output signals, said summing network including pull-up transistors coupled to pull-down transistors, and a bias compensation circuit for dynamically biasing said pull-down transistors so as to maintain said pull-down transistors in their saturation region of operation when said first and second intermediate output signals have high speed transitions.

6. The operational amplifier of claim 5 wherein said bias compensation circuit includes a differential circuit that outputs a control voltage inversely related to the sum of said first and second intermediate output voltages, said control voltage being coupled to said pull-down transistors.

7. The operational amplifier of claim 6,
   said pull-down transistors including two pairs of cascoded transistors, wherein a first transistor of each said pair of cascoded transistors is coupled to said control voltage;
   said bias compensation circuit including a control voltage level shifting circuit that generates a second control voltage having a predefined voltage offset from said control voltage, wherein a second transistor of each said pair of cascoded transistors is coupled to said second control voltage.

8. A CMOS operational amplifier comprising:
   a V+ input node and a V− input node;
   a CMOS differential input circuit, coupled to said V+ and V− input nodes, said CMOS differential input circuit including a pair of transistors, each of said pair of transistors having a gate coupled to a different one of said V+ and V− input nodes, and a current source, coupled to said pair of transistors, said current source supplying a controllable current to said pair of transistors; and
   a CMOS voltage tracking circuit coupled to said current source and said V+ and V− input nodes, said CMOS voltage tracking circuit generating a tracking voltage that corresponds to the one of said V+ and V− signals having a lower voltage and modulating said controllable current supplied by said current source in accordance with said tracking voltage so as to maintain said pair of transistors in a saturated, high gain state.

9. The CMOS operational amplifier of claim 8 wherein said current source includes a cascoded transistor pair, said cascoded transistor pair including a first current source transistor coupled to a second current source transistor.

10. The CMOS operational amplifier of claim 9 wherein said voltage tracking circuit includes a second pair of transistors, each of said second pair of transistors having a gate coupled to a different one of said V+ and V− input nodes.

11. The CMOS operational amplifier of claim 10 wherein said voltage tracking circuit further includes a level shifting circuit that generates a second tracking voltage having a predefined voltage offset from said tracking voltage, wherein said tracking voltage is coupled to said first current source transistor and said second tracking voltage is coupled to said second current source transistor.

12. The CMOS operational amplifier of claim 8 further comprising a second CMOS input circuit a second CMOS differential input circuit, coupled to said V+ and V−input nodes, said first and second CMOS differential input circuits generating first and second intermediate output signals;

an amplification stage circuit, including a summing network that combines said first and second intermediate output signals, said summing network including pull-up transistors coupled to pull-down transistors, and a bias compensation circuit for dynamically biasing said pull-down transistors so as to maintain said pull-down transistors in their saturation region of operation when said first and second intermediate output signals have high speed transitions.

13. The CMOS operational amplifier of claim 12 wherein said bias compensation circuit includes a differential circuit that outputs a control voltage inversely related to the sum of said first and second intermediate output voltages, said control voltage being coupled to said pull-down transistors.

14. The CMOS operational amplifier of claim 13,
said pull-down transistors including two pairs of cascoded transistors, wherein a first transistor of each said pair of cascoded transistors is coupled to said control voltage;

said bias compensation circuit including a control voltage level shifting circuit that generates a second control voltage having a predefined voltage offset from said control voltage, wherein a second transistor of each said pair of cascoded transistors is coupled to said second control voltage.

* * * * *